United States Patent
Kim et al.

(10) Patent No.: US 7,550,352 B2
(45) Date of Patent: Jun. 23, 2009

(54) MOS TRANSISTOR HAVING A RECESSED GATE ELECTRODE AND FABRICATION METHOD THEREOF

(75) Inventors: Jae-Hun Kim, Gyeonggi-do (KR); Kyu-Whan Chong, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 116 days.

(21) Appl. No.: 11/155,819

(22) Filed: Jun. 17, 2005

(65) Prior Publication Data

US 2005/0233513 A1    Oct. 20, 2005

Related U.S. Application Data

(62) Division of application No. 10/666,507, filed on Sep. 19, 2003, now Pat. No. 6,924,529.

(30) Foreign Application Priority Data

Dec. 13, 2002    (KR) ................................ 2002-79629

(51) Int. Cl.
*H01L 21/336* (2006.01)
*H01L 21/74* (2006.01)
*H01L 21/76* (2006.01)

(52) U.S. Cl. ........................ 438/270; 438/156; 438/268; 438/389

(58) Field of Classification Search ................ 438/259, 438/270

See application file for complete search history.

(56) References Cited

U.S. PATENT DOCUMENTS

| 5,317,346 A | 5/1994 | Garcia |
| 6,171,916 B1 | 1/2001 | Sugawara et al. |
| 6,358,800 B1 | 3/2002 | Tseng |
| 2003/0068864 A1* | 4/2003 | Il-Yong et al. ............... 438/270 |

FOREIGN PATENT DOCUMENTS

| JP | 2002-343963 | 11/2002 |
| KR | 1999-0040039 | 6/1999 |

* cited by examiner

*Primary Examiner*—N Drew Richards
*Assistant Examiner*—Pamela E Perkins
(74) *Attorney, Agent, or Firm*—Marger Johnson & McCollom, P.C.

(57) ABSTRACT

A MOS transistor having a recessed gate electrode and a fabrication method thereof are provided. The MOS transistor includes an isolation layer formed at a predetermined region of a semiconductor substrate to define an active region and double trench regions formed in the active region. The double trench region is composed of an upper trench region crossing the active region and a lower trench region located under the upper trench region. Thus, the active region is divided into two sub-active regions. Sidewalls of the upper trench region are covered with a spacer, which is used as an etching mask to form the lower trench region in the semiconductor substrate of the upper trench region. The upper and lower trench regions are then filled with a gate electrode. Also, high concentration source/drain regions are formed at the top surfaces of the sub-active regions respectively. Therefore, an effective channel length of the MOS transistor is determined according to the dimension of the lower trench region.

10 Claims, 6 Drawing Sheets

MOS TRANSISTOR HAVING A RECESSED GATE ELECTRODE AND FABRICATION METHOD THEREOF

CROSS-REFERENCE TO RELATED APPLICATION

This application is a Divisional of U.S. patent Ser. No. 10/666,507, filed on Sep. 19, 2003, now U.S. Pat. No. 6,924,529, which claims priority from Korean Patent Application No. 2002-79629, filed on Dec. 13, 2002, the contents of which are incorporated herein by reference in their entirety.

BACKGROUND OF THE INVENTION

1. Field of the Invention

This disclosure relates to a semiconductor device and, more particularly, to a MOS (metal-oxide-semiconductor) transistor having a recessed gate electrode and a fabrication method thereof.

2. Description of Related Art

Semiconductor devices comprise an integrated circuit composed of a plurality of discrete devices such as transistors. The transistors can be typically categorized as either MOS transistors or bipolar transistors. MOS transistors have various advantages over bipolar transistors. For instance, MOS transistors consume less power and have greater integration density characteristics as compared to bipolar transistors. Accordingly, MOS transistors are employed in the majority of semiconductor devices.

Recently, a MOS transistor having a recessed gate electrode has been proposed in order to increase the integration density of the semiconductor device. A fabrication method of the MOS transistor having the recessed gate electrode is taught in U.S. Pat. No. 6,358,800 to Tseng, entitled "method of forming a MOSFET with a recessed-gate having a channel length beyond photolithography limit".

FIG. 1 is a cross sectional view illustrating a MOS transistor disclosed in the U.S. Pat. No. 6,358,800.

Referring to FIG. 1, an isolation layer 112 is formed at a predetermined region of a semiconductor substrate 110, thereby defining an active region. A first insulating layer 114 and a second insulating layer (not shown) are sequentially formed on the entire surface of the substrate having the active region. The second insulating layer is patterned to a first opening over the active region. A third insulating layer is formed on the entire surface of the substrate including the first opening. The third and first insulating layers are then anisotropically etched to form a first oxide spacer 122 on the sidewall of the first opening and to simultaneously form a second opening that exposes a predetermined region of the active region, e.g., the semiconductor substrate (110).

The exposed semiconductor substrate is selectively etched to form a trench region. A second oxide spacer 128 is then formed on the sidewalls of the first oxide spacer 122 and the trench region. The second oxide spacer 128 contains dopants therein. A gate insulating layer 130 is formed on the bottom surface of the trench region. A gate electrode 132A, which fills the trench region, is formed on the gate insulating layer 130. The second insulating layer is removed to expose the first insulating layer 114. Impurity ions are implanted into the active region using the gate electrode 132A as an ion implantation mask. As a result, source/drain regions 136 are formed on both sides of the gate electrode 132A.

The substrate having the source/drain regions 136 is annealed to out-diffuse the dopants in the second oxide spacer 128. Thus, source/drain extensions 138 are formed at the sidewall of the trench region that is in contact with the second oxide spacer 128. Subsequently, a third spacer 140 is formed on the sidewall of the first oxide spacer 122. Finally, metal contacts 142 and 144 are selectively formed on the gate electrode 132A and the source/drain regions 136, respectively.

According to the foregoing prior art, it is possible to form a MOS transistor having a channel length shorter than the resolution limit of a photolithography process by using the first and second spacers 122 and 128. However, the source/drain extensions 138 are formed by the out-diffusion of the dopants contained in the second spacer 128. Accordingly, whenever a subsequent annealing process is performed, the dopants in the second spacer 128 may be further supplied into the source/drain extensions 138. As a result, the subsequent annealing process may cause the junction depth and width of the source/drain extensions 138 to increase, as well as the effective channel length (L of FIG. 1), corresponding to the distance between the source/drain extensions 138, to decrease. This is because the dopants in the source/drain extensions 138 can diffuse along a horizontal direction and a vertical direction. Thus, it is difficult to precisely control the junction depth of the source/drain extensions 138, as well as control the effective channel length L.

The source/drain extensions 138 correspond to an LDD (lightly doped drain) region of a conventional planar-type MOS transistor. The concentration of the dopants and the junction depth of the LDD region directly affect performance characteristics of the MOS transistor, such as drain breakdown voltage, hot carrier effect and short channel effect. However, according to the foregoing prior art, it is difficult to accurately control the concentration of the dopants in the source/drain extensions 138.

Further, the channel length is directly related to the width of the trench region. In other words, even if the depth of the trench region is increased, the channel length will not be changed. Therefore, the width of the trench region would have to be increased in order to form a MOS transistor having a long channel. As a result, even though semiconductor devices are fabricated using the above-mentioned prior art, it is difficult to obtain the same high integration density as semiconductor devices employing the conventional planar-type MOS transistors.

Embodiments of the invention address these and other deficiencies in the prior art.

SUMMARY OF THE INVENTION

Embodiments of the invention provide a MOS transistor that minimizes the fluctuation of the channel length due to a subsequent annealing process and a fabrication method thereof. As such, these embodiments provide a MOS transistor that is suitable for highly integrated semiconductor devices, and a fabrication method thereof.

BRIEF DESCRIPTION OF THE DRAWINGS

Other features and advantages of the present invention will be more readily understood from the following detailed description of specific embodiments thereof when read in conjunction with the accompanying drawings, in which.

DESCRIPTION OF THE PREFERRED EMBODIMENT

Figure 1:
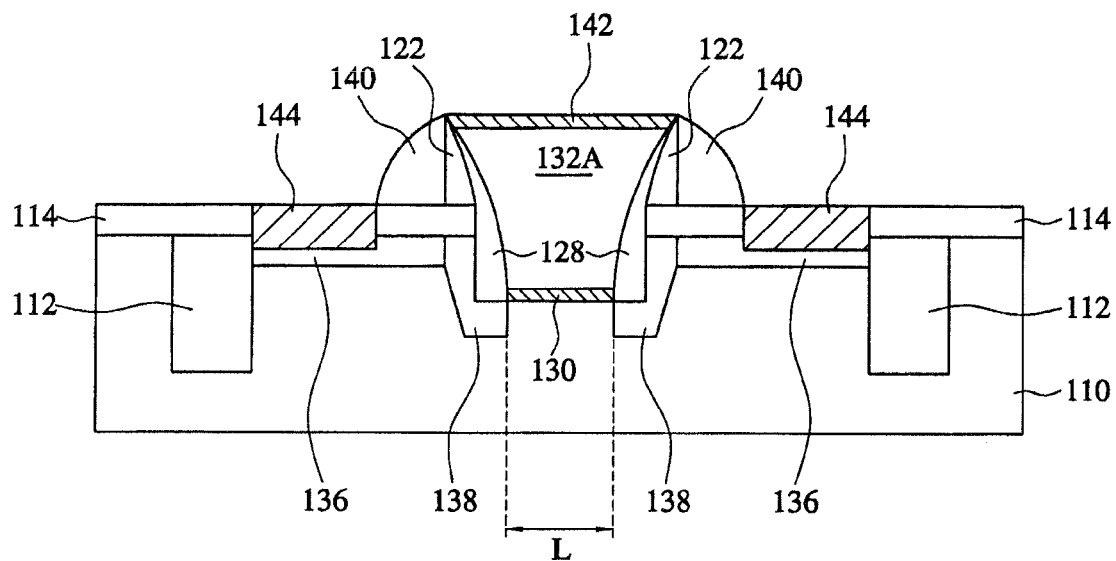
FIG. 1 is a cross sectional diagram illustrating a conventional MOS transistor.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout the specification.

Figure 2:
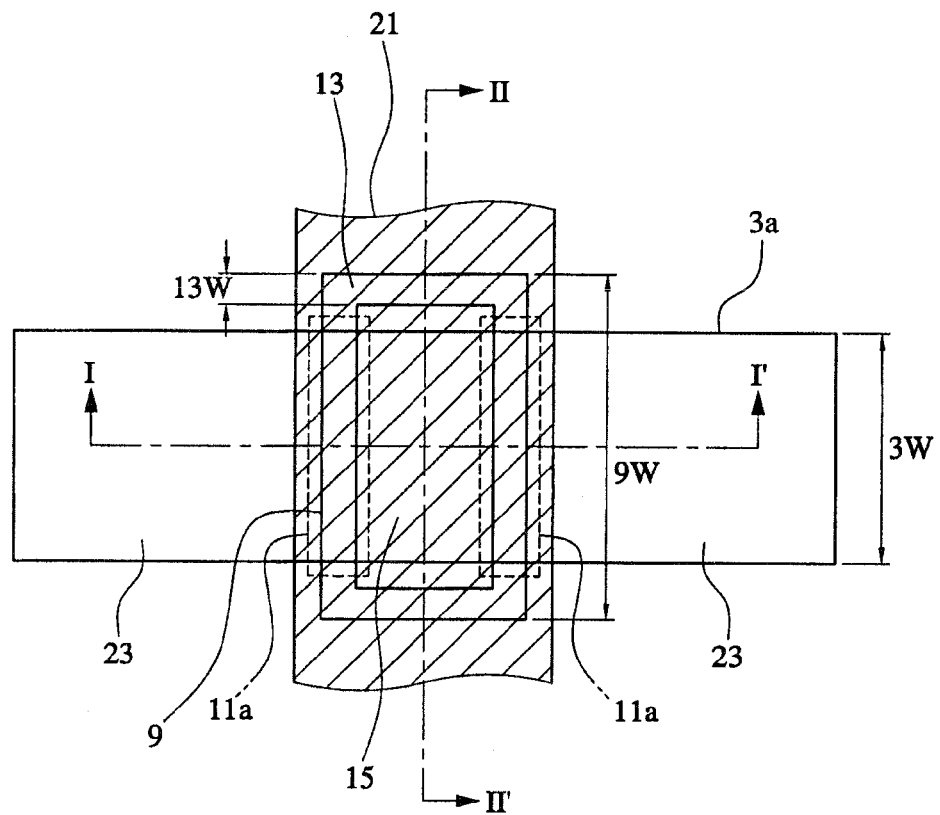
FIG. 2 is a top view diagram illustrating an example MOS transistor according to an embodiment of the invention.

FIG. 2 is a top view diagram illustrating a MOS transistor according to an embodiment of the present invention. Also, FIG. 3A is a cross sectional view taken along the line I-I' of FIG. 2, and FIG. 3B is a cross sectional view taken along the line II-II' of FIG. 2.

Figure 3A:
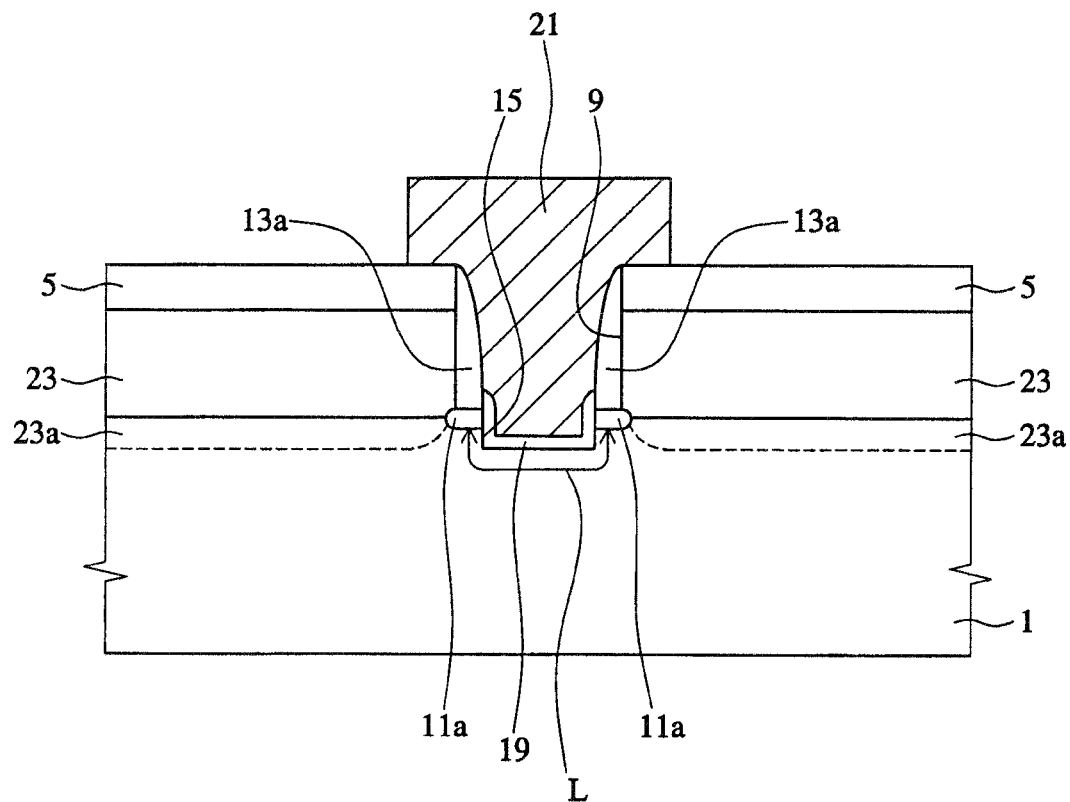
FIG. 3A is a cross sectional diagram taken along the line I-I' of FIG. 2.
Figure 3B:
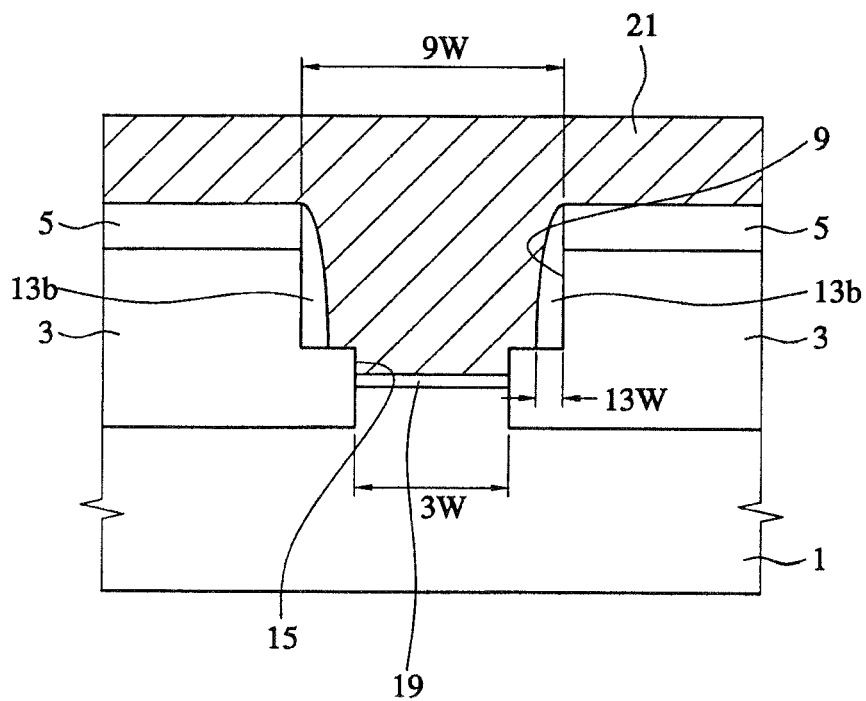
FIG. 3B is a cross sectional diagram taken along the line II-II' of FIG. 2.

Referring to FIGS. 2, 3A and 3B, an active region 3a is disposed at a predetermined region of a semiconductor substrate 1. An isolation layer 3 defines the active region 3a. An upper trench region 9 is disposed across a predetermined region of the active region 3a. A width 9W of the trench region 9 is preferably greater than a width 3W of the active region 3a. That is to say, it is preferable that the upper trench region 9 is extended so that it crosses the active region 3a. As a result, the active region 3a is divided into two sub-active regions, which are spaced apart from each other.

Sidewalls of the upper trench region 9 are covered with a spacer 13. In detail, at least a pair of sidewalls of the upper trench region 9, which are adjacent to the active region 3a, are covered with a first spacer 13a. In addition, a pair of sidewalls of the upper trench region 9, which are adjacent to the isolation region 3, may be covered with a second spacer 13b. In this case, the width 9W of the upper trench region 9 is preferably greater than the sum of twice the width (2×13W) of the second spacer 13b and the width 3W of the active region 3a. A width of the first spacer 13a may be equal to the width 13W of the second spacer 13b. Accordingly, the spacer 13 may include the first and second spacers 13a and 13b. Alternatively, the spacer 13 may include only the first spacer 13a.

A lower trench region 15 is provided under the upper trench region 9. The width of the lower trench region 15 is preferably equal to the width 3W of the active region 3a. In this case, the exposed sidewalls of the lower trench region 15 are in the isolation layer 3. Meanwhile, sidewalls of the lower trench region 15, which are adjacent to the active region 3a, are preferably aligned with the sidewall of the first spacer 13a, as shown in FIG. 3A.

A pair of low concentration source/drain regions 11a, which are separated from each other, may be formed under the first spacers 13a. The low concentration source/drain regions 11a are impurity regions, which are doped with impurities of a different conductivity type from the semiconductor substrate 1. Preferably, the low concentration source/drain regions 11a are shallower than the lower trench region 15. A distance taken along the bottom surface and sidewalls of the lower trench region 15 between the low concentration source/drain regions 11a corresponds to an effective channel length L. The bottom surface and sidewalls of the lower trench region 15 are covered with a gate insulating layer 19. This coverage also encompasses the sidewalls of the low concentration source/drain regions 11a.

The lower trench region 15 surrounded by the gate insulating layer 19 and the upper trench region 9 surrounded by the spacer 13 are filled with a gate electrode 21. The gate electrode 21 may be extended to cross over the active region 3a. In this case, an insulating layer 5 may be interposed between the gate electrode 21 and top surface of the active region 3a as shown in FIG. 3A. In addition, the insulating layer 5 may be interposed between the gate electrode 21 and the isolation layer 3 as shown in FIG. 3B. The spacers 13a and 13b can be extended to cover the sidewalls of the insulating layer 5.

High concentration source/drain regions 23 are formed at the top surfaces of the separated active regions 3a (the sub-active regions), which are located at both sides of the upper trench region 9. The high concentration source/drain regions 23 are formed to be in contact with the low concentration source/drain regions 11a.

Impurities in the high concentration source/drain regions 23 may be additionally diffused during a subsequent annealing process to form deep high concentration source/drain regions 23a. However, even though the deep high concentration source/drain regions 23a are formed, fluctuation of the effective channel length L is minimized.

Next, a fabrication method of a MOS transistor according to an embodiment of the present invention will be described.

Figure 4A:
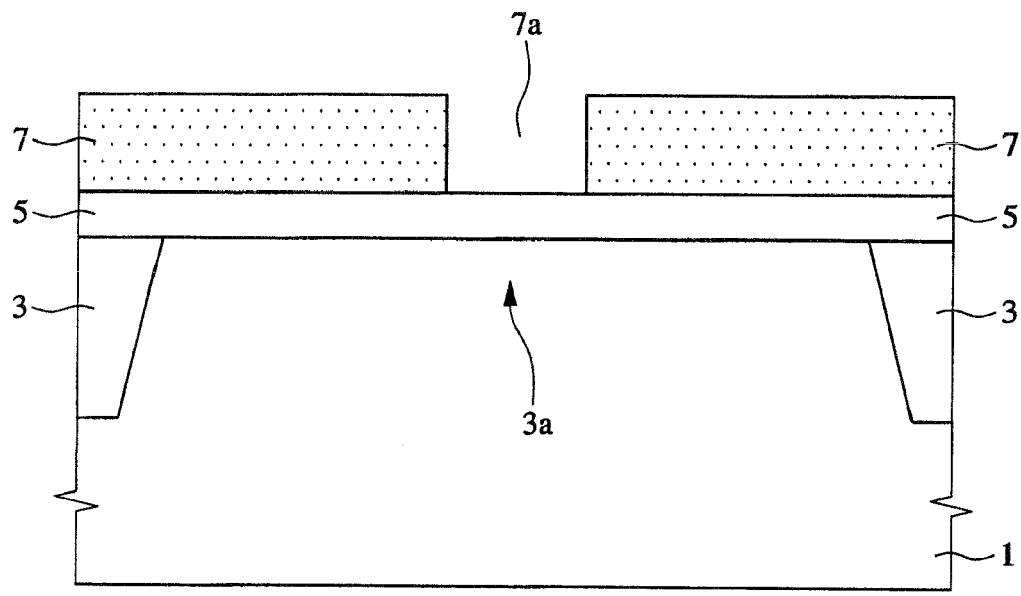
FIGS. 4A, 5A, 6A, and 7A are cross sectional diagrams taken along the line I-I' of FIG. 2 for explaining a method of fabricating a MOS transistor according to an embodiment of the invention.
Figure 4B:
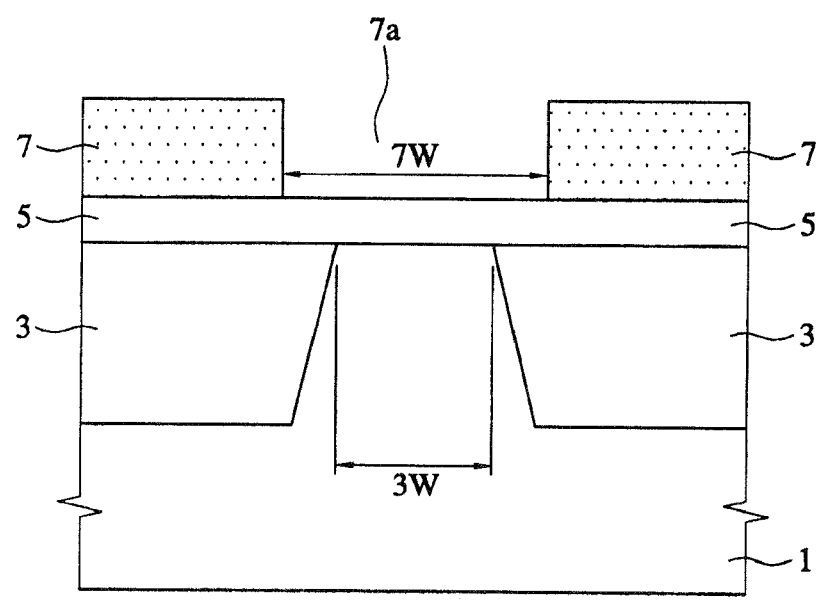
FIGS. 4B, 5B, 6B, and 7B are cross sectional diagrams taken along the line II-II' of FIG. 2 for explaining a method of fabricating a MOS transistor according to an embodiment of the invention.

Referring to FIGS. 2, 4A, and 4B, an isolation layer 3 is formed at a predetermined region of a semiconductor substrate 1, thereby defining an active region 3a. A pad oxide layer 5 and a pad nitride layer 7 are sequentially formed on the substrate having the isolation layer 3. The pad nitride layer 7 is patterned to form an opening 7a that crosses over the active region 3a. A width 7W of the opening 7a is preferably greater than a width 3W of the active region 3a as shown in FIG. 4B.

Figure 5A:
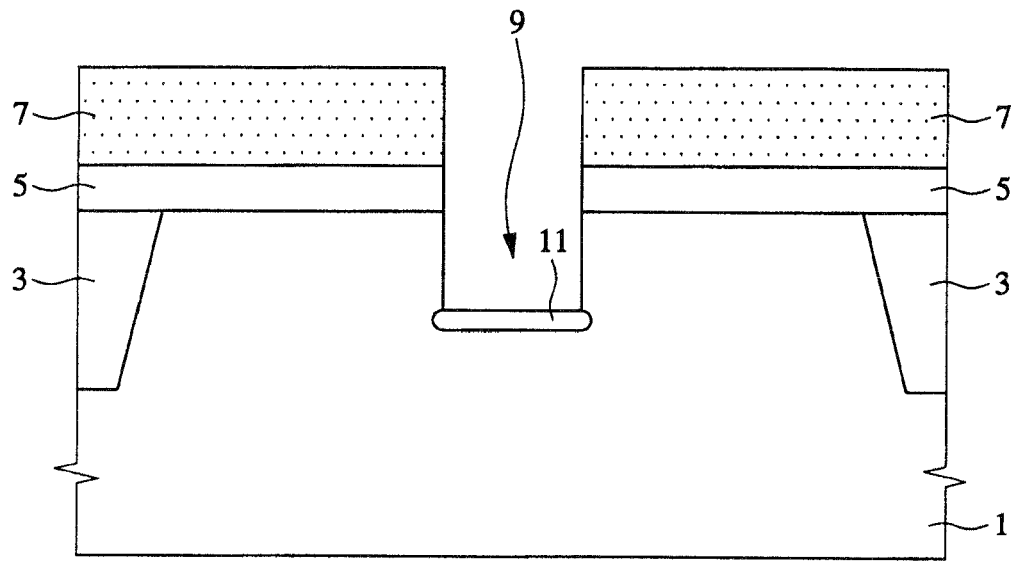
Figure 5B:
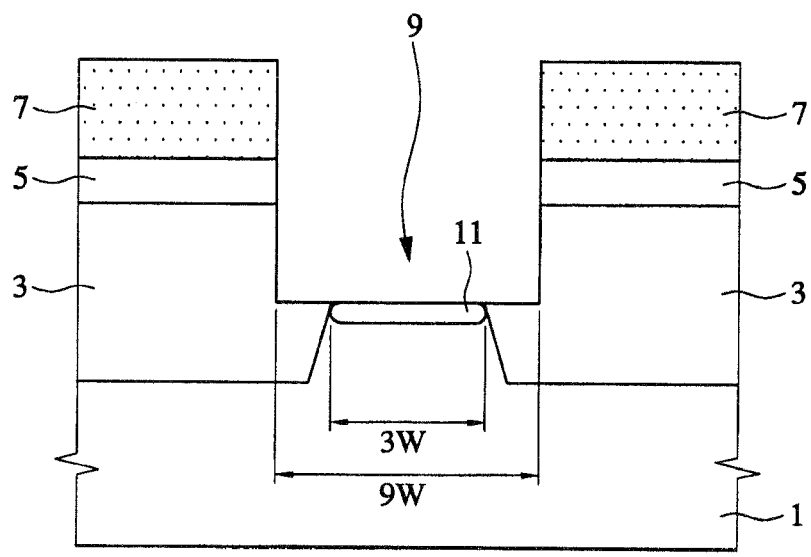

Referring to FIGS. 2, 5A, and 5B, using the patterned pad nitride layer 7 as an etching mask, the pad oxide layer 5, the isolation layer 3, and the semiconductor substrate 1 are etched to form an upper trench region 9 that crosses the active region 3a. As a result, the active region 3a is divided into two sub-active regions. First impurity ions may be implanted into the semiconductor substrate 1 using the patterned pad nitride layer 7 as an ion implantation mask, thereby forming a low concentration impurity layer 11. The first impurity ions have a different conductivity type from the semiconductor substrate 1. For example, in the event that the semiconductor substrate 1 is P-type, the first impurity ions may be N-type impurity ions such as phosphorous ions or arsenic ions. Also, the first impurity ions are implanted with a relatively low dose of, for example, $1\times10^{12}$ to $1\times10^{14}$ ions/cm$^2$.

Figure 6A:
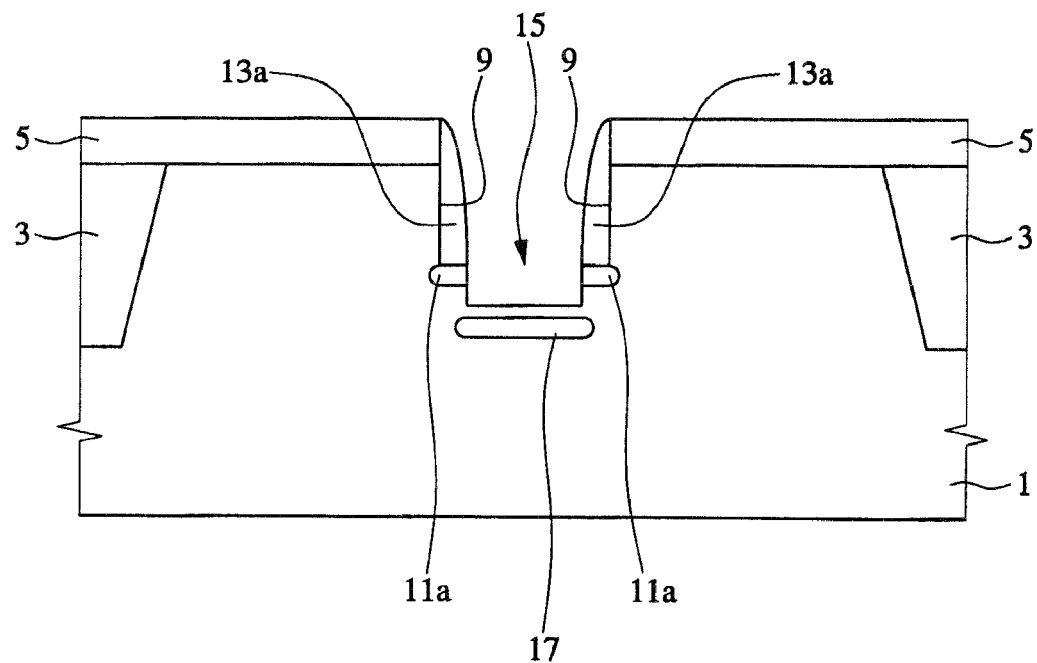
Figure 6B:
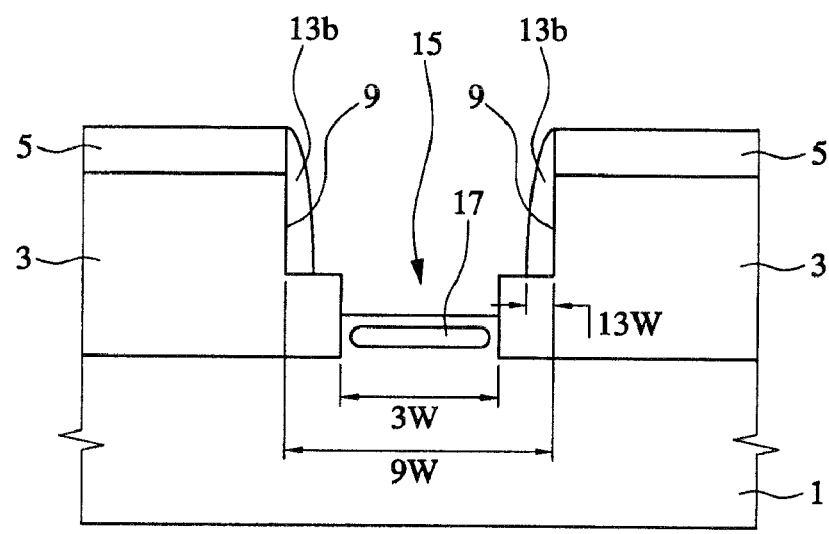

Referring to FIGS. 2, 6A, and 6B, the patterned pad nitride layer 7 is selectively removed. A conformal spacer insulating layer (not shown) is formed on the substrate where the patterned pad nitride layer 7 was selectively removed. The spacer insulating layer is formed of a silicon oxide layer or a silicon nitride layer. The spacer insulating layer is anisotropically etched to form a spacer 13 that covers the sidewalls of the upper trench region 9 and the patterned pad oxide layer 5. The spacer 13 includes a pair of first spacers (13a of FIG. 6A)

formed on sidewalls adjacent to the active region 3a, and a pair of second spacers (13b of FIG. 6B) formed on the sidewalls adjacent to the isolation layer 3. In this case, the width 9W of the upper trench region 9 is preferably greater than the sum of twice width (2×13W) of the second spacer 13b and the width 3W of the active region 3a as shown in FIG. 6B.

The second spacers 13b may be selectively removed using a photolithography process and an etching process. In this case, the spacer 13 includes only the first spacers 13a. Thus, the width 9W of the upper trench region 9 is preferably greater than the width 3W of the active region 3a.

Subsequently, the semiconductor substrate 1 in the upper trench region 9 is selectively etched using the spacer 13 and the patterned pad oxide layer 5 as an etching mask. As a result, a lower trench region 15 is formed under the upper trench region 9. Accordingly, the lower trench region 15 may have the same width as the active region 3a as shown in FIG. 6B. Preferably, the lower trench region 15 is formed to be deeper than the low concentration impurity layer 11. In this case, a pair of low concentration source/drain regions 11a, which are separated from each other, are left at both sides of the lower trench region 15 respectively (refer to FIG. 6A). In other words, the low concentration source/drain regions 11a may be located under the first spacers 13a. N-type impurity ions or P-type impurity ions may be selectively implanted into the semiconductor substrate 1 in the lower trench region 15, thereby forming a channel ion implantation region 17. The channel ion implantation region 17 is formed to adjust a threshold voltage and/or a punch-through voltage.

Figure 7A:
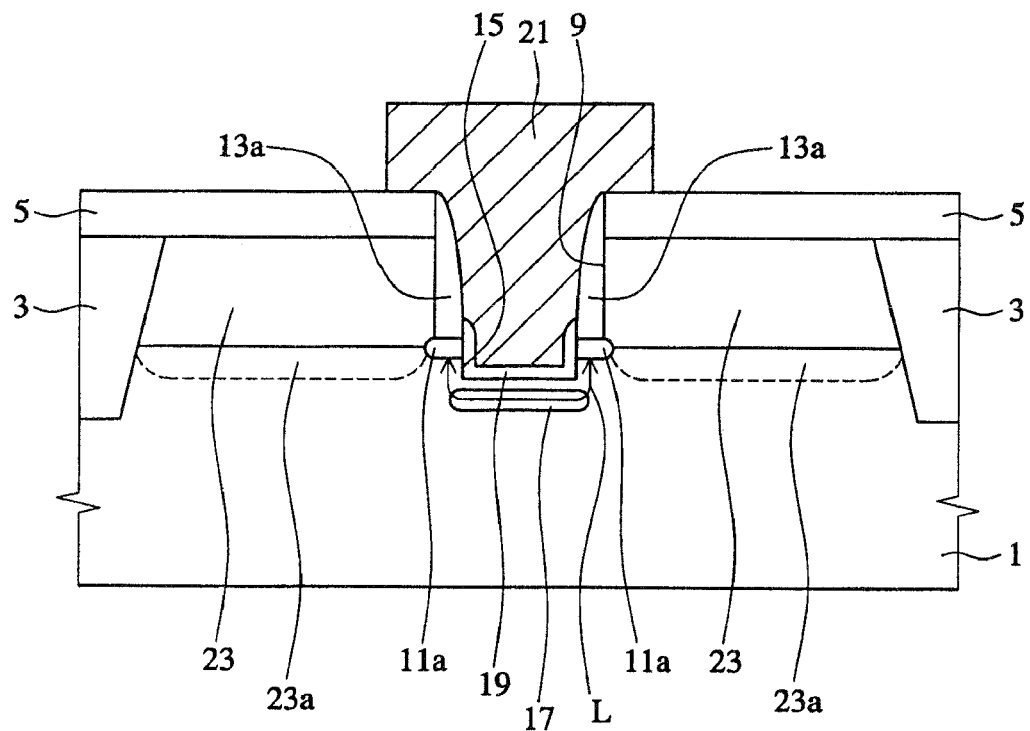
Figure 7B:
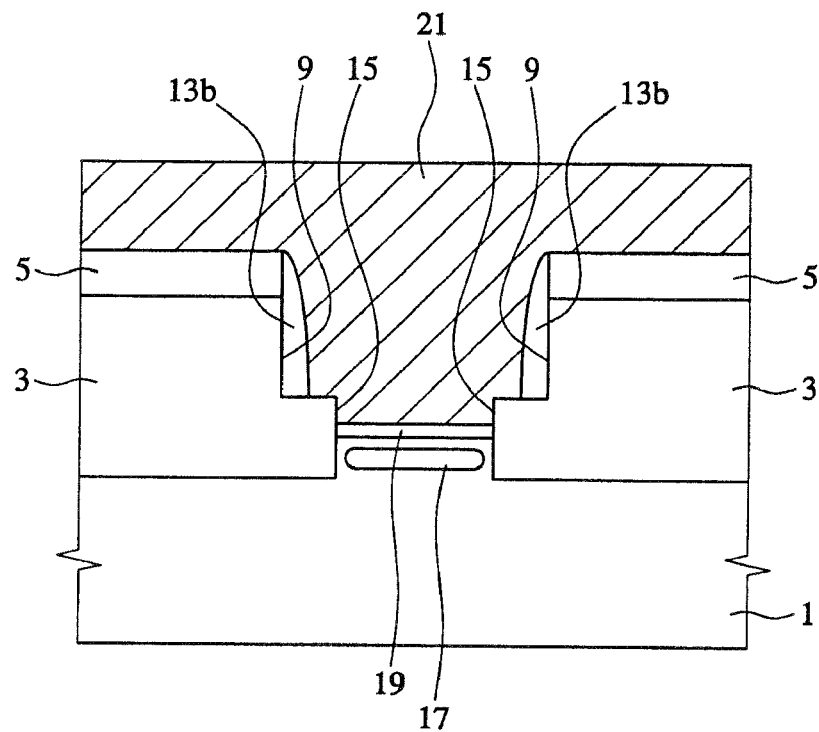

Referring to FIGS. 2, 7A, and 7B, a gate insulating layer 19 is formed on the bottom surface and sidewalls of the lower trench region 15. The gate insulating layer 19 can be formed using a thermal oxidation process. A gate conductive layer is formed on the entire surface of the substrate having the gate insulating layer 19. The gate conductive layer may be formed of a doped polysilicon layer that exhibits good step coverage. Therefore, the gate conductive layer completely fills the lower trench region 15, which is surrounded by the gate insulating layer 19, and the upper trench region 9, which is surrounded by the spacer 13. The gate conductive layer is then patterned so that a gate electrode 21 crosses over the active region 3a and fills the lower and upper trench regions 9 and 15.

Second impurity ions are implanted into the active region 3a using the gate electrode 21 and the isolation layer 3 as an ion implantation mask. The second impurity ions may be implanted, for example, with a relatively high dose of $1\times10^{15}$ to $5\times10^{15}$ ions/cm$^2$. The second impurity ions also have a different conductivity type from the semiconductor substrate 1. As a result, a pair of high concentration source/drain regions 23 are formed at the top surfaces of the sub-active regions, which are located at both sides of the gate electrode 21, respectively. The high concentration source/drain regions 23 are preferably formed to be in contact with the low concentration source/drain regions 11a. A distance taken along the surface of the lower trench region 15 between the low concentration source/drain regions 11a corresponds to an effective channel length L.

The impurities in the high concentration source/drain regions 23 may additionally be diffused during a subsequent annealing process. As a result, deep high concentration source/drain regions 23a may be formed. In this case, the low concentration source/drain regions 11a are less diffused as compared to the high concentration source/drain regions 23. This is because the impurity concentration of the low concentration source/drain regions 11a is lower than that of the high concentration source/drain regions 23. In addition, embodiments of the present invention may not include the material layer that continuously supplies the impurities into the low concentration source/drain regions 11a. Thus, even though the low concentration source/drain regions 11a are additionally diffused, it is able to optimize the effective channel length L by increasing the depth of the lower trench region 15. In other words, these embodiments can prevent an increase in the planar area of the MOS transistor. As a result, it is possible to realize a high performance MOS transistor that is adequate for highly integrated semiconductor devices.

According to an aspect of the present invention, a MOS transistor having a recessed gate electrode is provided. The MOS transistor comprises an isolation layer formed at a predetermined region of a semiconductor substrate. The isolation layer defines an active region. An upper trench region is provided in a predetermined region of the active region. The upper trench region is disposed across the active region. At least both sidewalls of the upper trench region, which are in contact with the active region, are covered a spacer. A lower trench region is provided under the upper trench region and is surrounded by the spacer. A couple of source/drain regions are disposed at the surface of the active region, and are located at both sides of the upper trench region, respectively. The bottom surface and a sidewall of the lower trench region are covered with a gate insulating layer. A gate electrode fills the lower trench region, which is surrounded by the gate insulating layer, and the upper trench region, which is surrounded by the spacer.

Preferably, the upper trench region has a greater width than the active region.

The spacer may comprise a first spacer adjacent to the active region and a second spacer adjacent to the isolation layer. The width of the first spacer may be equal to that of the second spacer. The upper trench region has a width, which is equal to or greater than the sum of twice the width of the second spacer and the width of the active region.

A low concentration source/drain region may be additionally disposed in the semiconductor substrate under the first spacer. The low concentration source/drain region is in contact with the sidewall of the lower trench region. More preferably, the low concentration source/drain region is in contact with the upper sidewall of the lower trench region.

Also, it is preferable that the lower trench region has the same width as the active region. In this case, the lower trench region comprises a couple of sidewalls that are adjacent to the isolation layer and another couple of sidewalls that are adjacent to the active region. The sidewalls adjacent to the isolation layer face each other, and the other sidewalls, adjacent to the active region, also face each other.

According to another aspect of the present invention, a method of fabricating a MOS transistor having a recessed gate electrode is provided. The method comprises forming an isolation layer at a predetermined region of a semiconductor substrate to define an active region and etching a predetermined region of the active region to form an upper trench region that crosses the active region. A spacer is formed on at least both sidewalls that are adjacent to the active region. The semiconductor substrate in the upper trench region is selectively etched using the spacer as an etching mask, thereby forming a lower trench region under the upper trench region. A gate insulating layer is formed on the sidewalls and bottom surface of the lower trench region. A gate electrode is then formed in the lower trench region, which is surrounded by the gate insulating layer, and the upper trench region, which is surrounded by the spacer. A couple of high concentration source/drain regions are formed at the surface of the active region, and are located at both sides of the upper trench region, respectively.

A low concentration impurity region having a different conductivity from the semiconductor substrate may also be formed at the bottom surface of the upper trench region prior to formation of the spacer. In this case, the lower trench region is preferably formed to be deeper than the low concentration impurity region. Thus, a couple of low concentration source/drain regions, which are separated from each other, are left at both sides of the lower trench region respectively.

Those skilled in the art recognize that the method of forming MOS transistors described herein can be implemented in many different variations. Therefore, although various embodiments are specifically illustrated and described herein, it will be appreciated that modifications and variations of the present invention are covered by the above teachings and within the purview of the appending claims without departing from the spirit and intended scope of the invention.

What is claimed is:

1. A method of fabricating a MOS transistor comprising:
    forming an isolation layer at a predetermined region of a semiconductor substrate to define an active region;
    etching a predetermined region of the active region to form an upper trench region that crosses the active region, the upper trench region dividing the active region into two sub-active regions;
    forming a low concentration impurity layer under a bottom surface of the upper trench region, the low concentration impurity layer having a different conductivity type from the semiconductor substrate;
    forming a spacer on sidewalls of the upper trench region that are adjacent to the sub-active regions;
    selectively etching the semiconductor substrate in the upper trench region using the spacer as an etching mask to form a lower trench region under the upper trench region;
    forming a gate insulating layer on sidewalls and a bottom surface of the lower trench region;
    forming a gate electrode that fills the lower trench region, surrounded by the gate insulating layer, and that fills the upper trench region, surrounded by the spacer; and
    forming a pair of high concentration source/drain regions at top surfaces of the sub-active regions that are located at both sides of the upper trench region respectively,
    wherein the low concentration impurity layer under the bottom surface of the upper trench region is formed prior to formation of the spacer.

2. The method of claim 1, wherein forming the upper trench region comprises:
    sequentially forming a pad oxide layer and a pad nitride layer on an entire surface of the substrate having the isolation layer;
    patterning the pad nitride layer to form an opening that crosses over the active region;
    successively etching the pad oxide layer and the semiconductor substrate using the pad nitride layer as an etching mask; and
    removing the patterned pad nitride layer, the spacer being formed on sidewalls of the upper trench region and the etched pad oxide layer.

3. The method of claim 2, wherein the opening is formed to have a greater width than the active region.

4. The method of claim 1, wherein forming the spacer comprises:
    forming a conformal spacer insulating layer on an entire surface of the substrate having the upper trench region; and
    anisotropically etching the spacer insulating layer to form a pair of first spacers adjacent to the active region and a pair of second spacers adjacent to the isolation layer, a distance between the second spacers is equal to or greater than the width of the active region.

5. The method of claim 4, wherein the spacer insulating layer is formed of a silicon oxide layer or a silicon nitride layer.

6. The method of claim 1, wherein the lower trench region is formed to be deeper than the low concentration impurity layer, to leave a pair of low concentration source/drain regions that are separated from each other and are located at both sides of the lower trench region.

7. The method of claim 1, wherein the lower trench region is formed to have the same width as the active region.

8. The method of claim 1, wherein forming the gate electrode comprises:
    forming a gate conductive layer on an entire surface of the substrate including the gate insulating layer; and
    patterning the gate conductive layer to form a gate conductive layer pattern that fills the upper and lower trench regions and crosses the active region.

9. The method of claim 1, wherein forming the pair of high concentration source/drain regions comprises implanting impurity ions into the sub-active regions.

10. The method of claim 9, wherein implanting impurity ions into the sub-active regions is performed using the gate electrode as a mask.

* * * * *

UNITED STATES PATENT AND TRADEMARK OFFICE
CERTIFICATE OF CORRECTION

| | | |
|---|---|---|
| PATENT NO. | : 7,550,352 B2 | Page 1 of 1 |
| APPLICATION NO. | : 11/155819 | |
| DATED | : June 23, 2009 | |
| INVENTOR(S) | : Jae-Hun Kim et al. | |

It is certified that error appears in the above-identified patent and that said Letters Patent is hereby corrected as shown below:

On the title page, item (56), Foreign Patent Documents, insert Reference -- KR 2000-0028096 5/2000 --.

Signed and Sealed this

Twenty-seventh Day of October, 2009

David J. Kappos
*Director of the United States Patent and Trademark Office*